United States Patent
Kinsman

[11] Patent Number: 6,153,924
[45] Date of Patent: Nov. 28, 2000

[54] MULTILAYERED LEAD FRAME FOR SEMICONDUCTOR PACKAGE

[75] Inventor: Larry D. Kinsman, Boise, Id.

[73] Assignee: Micron Technology, Inc., Boise, Id.

[21] Appl. No.: 09/460,047

[22] Filed: Dec. 13, 1999

Related U.S. Application Data

[63] Continuation of application No. 09/027,845, Feb. 23, 1998, Pat. No. 6,002,165.

[51] Int. Cl.⁷ .................................................. H01L 23/495
[52] U.S. Cl. ......................... 257/666; 257/691; 257/675
[58] Field of Search .................................. 257/666, 691, 257/675, 664, 674, 632, 676, 706

[56] References Cited

U.S. PATENT DOCUMENTS

| | | |
|---|---|---|
| 4,513,355 | 4/1985 | Schroeder et al. . |
| 4,835,120 | 5/1989 | Mallik et al. . |
| 5,043,534 | 8/1991 | Mahulikar et al. . |
| 5,089,878 | 2/1992 | Lee . |
| 5,220,195 | 6/1993 | McShane et al. . |
| 5,498,901 | 3/1996 | Chillara et al. . |
| 5,548,160 | 8/1996 | Corbett et al. . |
| 5,559,306 | 9/1996 | Mahulikar . |
| 5,629,561 | 5/1997 | Shin et al. . |
| 5,666,003 | 9/1997 | Shibata et al. . |
| 5,672,548 | 9/1997 | Culmane et al. . |
| 5,696,033 | 12/1997 | Kinsman . |
| 5,767,572 | 6/1998 | Fujitsu . |

*Primary Examiner*—Sheila V. Clark
*Attorney, Agent, or Firm*—Stephen A. Gratton

[57] ABSTRACT

A multi layered semiconductor lead frame, and a semiconductor package fabricated using the lead frame are provided. The lead frame includes a lead plate having multiple die mounting sites configured for molding multiple semiconductor packages. The lead plate includes lead fingers that form the terminal leads and internal signal traces for the molded packages. Each package includes a die mounting plate, and a ring plate attached to opposing sides of a portion of the lead plate. The die mounting plates and ring plates provide ground or voltage planes for the packages. In addition, the die mounting plates and ring plates provide improved heat transfer, reduced inductance, and matched impedance for the packages.

31 Claims, 4 Drawing Sheets

MULTILAYERED LEAD FRAME FOR SEMICONDUCTOR PACKAGE

CROSS REFERENCE TO RELATED APPLICATIONS

This application is a continuation of application Ser. No. 09/027,845, filed on Feb. 23, 1998, U.S. Pat. No. 6,002,165.

FIELD OF THE INVENTION

This invention relates generally to semiconductor packaging, and specifically to an improved multi layered lead frame that includes power and ground planes. This invention also relates to an improved semiconductor package fabricated using the lead frame.

BACKGROUND OF THE INVENTION

Plastic semiconductor packages are fabricated using lead frames. A conventional lead frame comprises a stamped, or etched metal strip, adapted to support multiple dice for packaging. A conventional plastic package includes a semiconductor die attached to a portion of the lead frame, and encapsulated in a plastic body. The lead frame supports the dice during the molding process, and provides the terminal leads in the completed packages.

One type of lead frame includes separate metal plates that function as power and ground buses for the die. Such a lead frame is described in U.S. Pat. No. 4,835,120 to Mallik et al.

Figure 1:
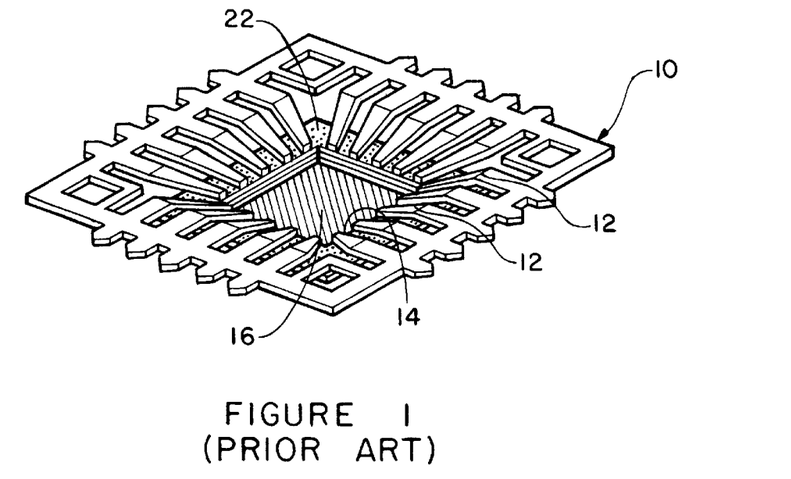
FIG. 1 is a perspective view of a prior art multi layered lead frame.
Figure 2:
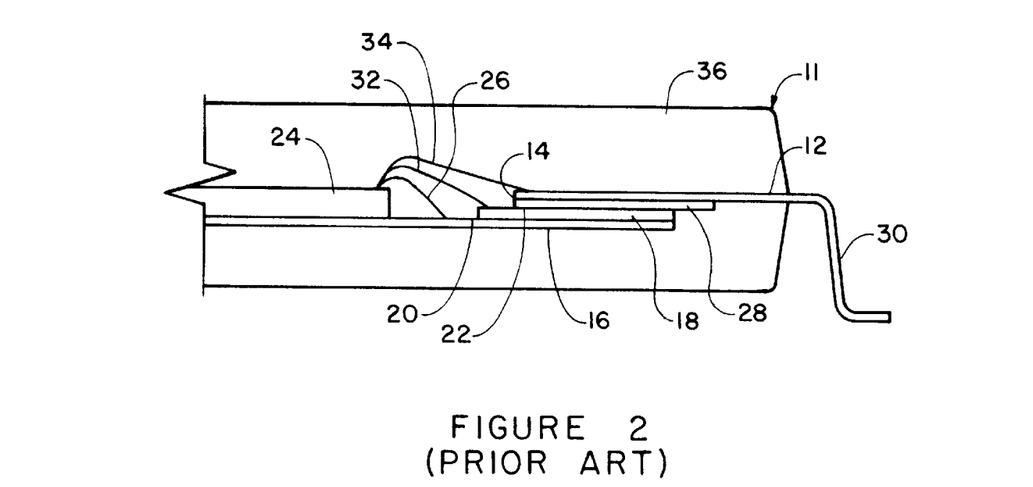
FIG. 2 is a cross sectional view of a prior art semiconductor package constructed using the multi layered lead frame of FIG. 1.

FIG. 1 illustrates the lead frame 10, and FIG. 2 illustrates a package 11 constructed using the lead frame 10. As shown in FIG. 1, the lead frame 10 includes lead fingers 12 arranged in a peripheral pattern around a rectangular shaped opening 14. In the completed package 11, the lead fingers 12 are shaped to form package leads 30 (FIG. 2). The lead frame 10 also includes a power plate 16, and a ground plate 18, which are attached to the lead fingers 12 using adhesive layers 20, 22.

The power plate 16 covers one side of the opening 14, and provides a surface for mounting a semiconductor die 24 (FIG. 2). In the completed package 11, wires 26 are wire bonded to selected bond pads on the die 24 (e.g., Vcc pads) and to bonding sites on the power plate 16. Selected tabs 28 on the lead frame 10 provide conductive paths from the power plate 16 to appropriate power leads 30 for the package 11. In a similar manner, wires 32 are bonded to selected bond pads on the die 24 (e.g., Vss pads) and to bonding sites on the ground plate 18. Other selected tabs 28 on the lead frame 10 provide conductive paths from the ground plate 18 to appropriate ground leads 30 for the package 11. In addition to wires 26 and 32, wires 34 are bonded to selected bond pads on the die 24 (e.g., signal pads) and to appropriate signal leads 30 for the package 11. Following wire bonding, a transfer molding process can be used to form a plastic body 36 which encapsulates the wires 26, 32, 34, die 24, and lead fingers 12.

A positive aspect of the package 11 is that inductance between the power and ground pads on the die 24 is reduced. This results from multiple power and ground leads being replaced by a single power plate 16 and ground plate 18, which are low inductance metal planes. The power plate 16 and the ground plate 18 also function as heat sinks for dissipating heat generated by the die 24.

A negative aspect of the package 11 is that the power plate 16 and the ground plate 18 are both located on the same side of the lead frame 10. This construction can stress the lead frame 10 and cause the plastic body 36 to bow. Also, heat transfer is only provided from a backside of the die.

The present invention is directed to a multi layered lead frame that includes ground and power plates for reducing inductance in semiconductor packages as described above. In addition, the lead frame of the invention locates the ground and power plates on either side of the lead fingers and package leads. This allows stresses on the lead frame to be balanced, and reduces bowing of the package. In addition, improved heat transfer from the die is provided, and an impedance of the package leads can be matched to other electrical components, such as signal leads of a module for the package.

SUMMARY OF THE INVENTION

In accordance with the present invention, an improved multi layered lead frame, and an improved semiconductor package fabricated using the lead frame are provided. The lead frame can be used to fabricate semiconductor packages using a transfer molding process.

The lead frame includes a lead plate having multiple patterns of lead fingers. Preferably, the lead plate comprises a metal plate which can be stamped or etched with the patterns of lead fingers. The lead plate can be similar in construction to a conventional lead frame but without die mounting paddles. The lead fingers include tip portions for wire bonding to bond pads on the dice, and terminal portions for forming the terminal leads of the packages. The lead fingers thus provide the internal signal traces and terminal leads for the completed packages.

In addition to the lead plate, the lead frame includes multiple die mounting plates attached to a first side of the lead plate. Each die mounting plate is adapted to mount a semiconductor die within a pattern of lead fingers. Each die mounting plate includes bonding sites configured for wire bonding to selected bond pads on the die to provide a power plane (Vcc), or a ground plane (Vss), for the die.

The lead frame also includes multiple ring plates attached to a second side of the lead plate. Each ring plate includes a through opening sized and shaped to enclose a die mounted on a corresponding die mounting plate of the lead frame. The ring plate includes bonding sites configured for wire bonding to selected bond pads on the die to provide a power plane (Vcc), or a ground plane (Vss), for the die.

In addition to providing power and ground planes for the semiconductor packages, the die mounting plates and ring plates can be spaced from the signal traces by distances selected to match an impedance of the signal traces to other electrical components, such as conductive traces in an electronic assembly incorporating the packages. The die mounting plates and ring plates also provide heat transfer surfaces for conducting heat generated by the packages. In addition, the die mounting plates and ring plates help to balance stresses, and prevent bowing of the packages.

DETAILED DESCRIPTION OF THE PREFERRED EMBODIMENTS

Figure 3:
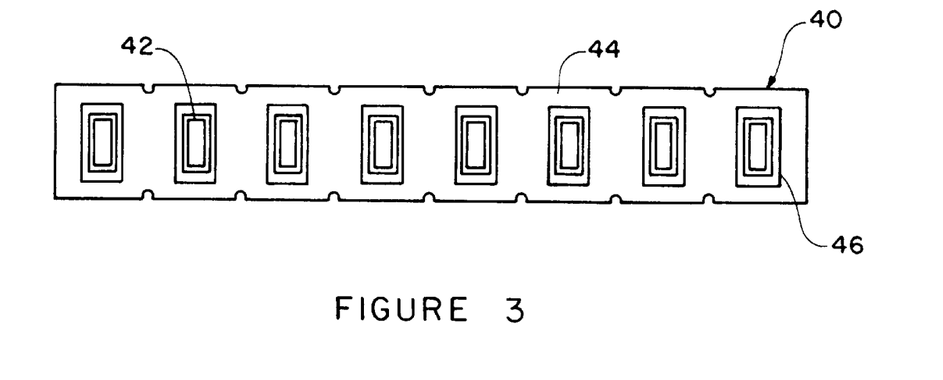
FIG. 3 is a schematic plan view with parts removed of a lead frame constructed in accordance with the invention.
Figure 4A:
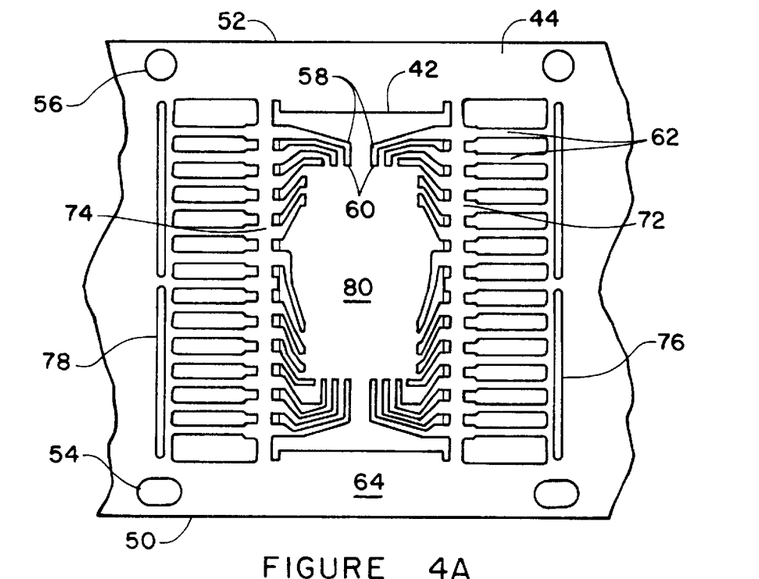
FIG. 4A is an enlarged plan view of a portion of the lead frame with a layer removed to illustrate lead fingers of the lead frame.
Figure 4B:
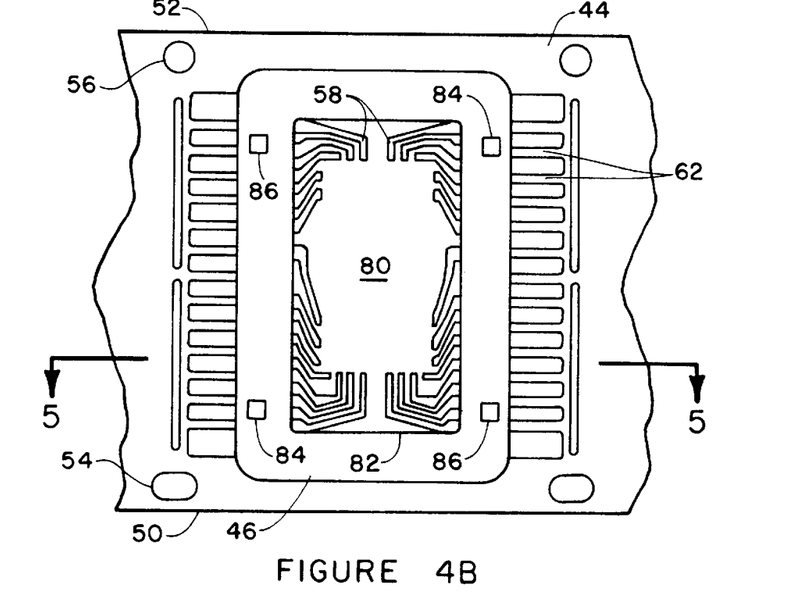
FIG. 4B is an enlarged plan view of a portion of the lead frame.
Figure 5:
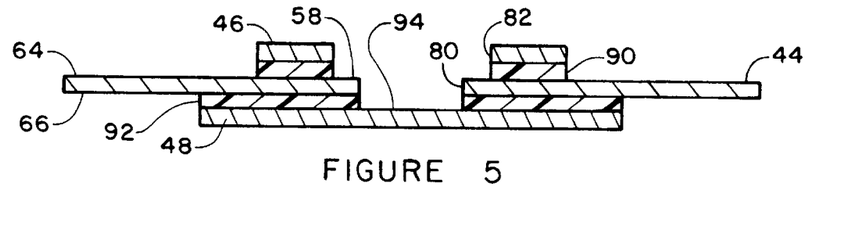
FIG. 5 is a cross sectional view taken along section line 5—5 of FIG. 4B.
Figure 6:
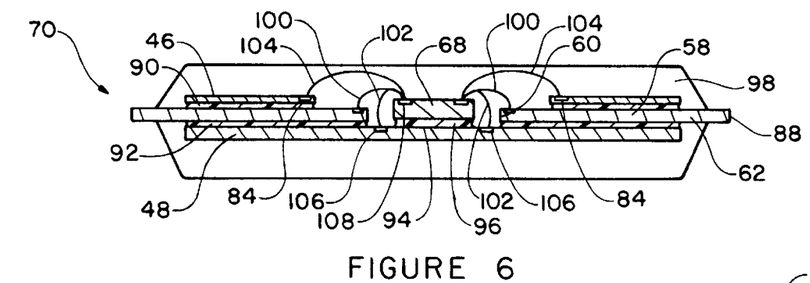
FIG. 6 is an enlarged cross sectional view of a semiconductor package fabricated using the lead frame.

Referring to FIGS. 3–5, a multi layered lead frame 40 constructed in accordance with the invention is illustrated. The lead frame 40 includes multiple die mounting sites 42 which are represented by the inner rectangles in FIG. 3. In an illustrative embodiment the lead frame 40 includes eight die mounting sites 42. However, this number is merely exemplary, and a greater or lesser number of die mounting sites 42 can be employed. Each die mounting site 42 on the lead frame 40 can be used to encapsulate a semiconductor die 68 (FIG. 6) to form a semiconductor package 70 (FIG. 6).

The lead frame 40, broadly stated, comprises: a lead plate 44; a ring plate 46 (FIG. 4B) for each die mounting site 42; and a die mounting plate 48 (FIG. 5) for each die mounting site 42.

The lead plate 44 is a flat planar member having a first side 64 (FIG. 5) wherein the ring plates 46 are mounted, and an opposing second side 66 (FIG. 5) wherein the die mounting plates 48 are mounted. A portion of the lead plate 44 is shown separately in FIG. 4A prior to attachment of the ring plates 46 and die mounting plates 48.

The lead plate 44 can be similar in construction to a conventional lead frame but without die mounting paddles. As such, the lead plate 44 includes side rails 50, 52 having patterns of openings 54, 56 formed therein. The side rails 50, 52 and openings 54, 56 permit handling of the lead frame 40 by automated packaging machinery.

The lead plate 44 also includes a pattern of lead fingers 58 associated with each die mounting site 42. The lead fingers 58 include tip portions 60 and terminal portions 62. The peripheral edges of the tip portions 60 of each pattern of lead fingers 58 form a generally rectangular shaped opening 80 wherein a die 68 (FIG. 6) is mounted. The tip portions 58 of the lead fingers 58 are adapted for wire bonding to bonding pads on the die 68 (FIG. 6). In addition, the tip portions 60 of the lead fingers 58 form internal signal traces for the semiconductor package 70 (FIG. 6). The terminal portions 62 of the lead fingers 58 form terminal leads 88 (FIG. 6) for the semiconductor package 70 (FIG. 6).

The tip portions 60 and terminal portions 62 of the lead fingers 58 are joined together and stabilized by connecting segments 72, 74. Following the molding process the connecting segments 72, 74 between the lead fingers 58 will be severed, such that each tip portion 60, and its associated terminal portion 60, forms a separate conductive path through the package 70 (FIG. 6). The lead plate 44 also includes through slots 76, 78 which define the boundaries between each die mounting site 42. The lead plate 44 can be severed in a transverse direction through the slots 76, 78 to form a plurality of separate packages 70 (FIG. 6).

Referring to FIG. 4B, a ring plate 46 is shown following attachment to the lead plate 44. In the illustrative embodiment, each ring plate 46 comprises a generally rectangular shaped, frame-like member, with a generally rectangular shaped opening 82. Alternately, the ring plate 46 can have other configurations such as a donut shape with a circular opening. The opening 82 in the ring plate 46 is sized to encompass the tip portions 60 of the lead fingers 58. In addition, the opening 82 in the ring plate 46 can be slightly larger than the opening 80 defined by the tip portions 60 of the lead fingers 58.

Preferably the ring plate 46 comprises a highly conductive metal such as copper, aluminum, nickel, titanium, silver or an alloy of these metals. A representative thickness of the ring plate 46 can be from about 5 mils (0.005") to 15 mils (0.015") or greater.

The ring plate 46 can include one or more die bonding sites 84 configured for wire bonding to selected bond pads on the die 68 (FIG. 6). The ring plate 46 can also include one or more lead bonding sites 86 configured for wire bonding to bonding sites on the lead portions 62 of selected lead fingers 58. Depending on the material of the ring plate 46, the bonding sites 84 or 86 can merely be areas on the ring plate 46, or alternately areas plated with a wire bondable metal such as silver.

As will be further explained, using the bonding sites 84 or 86, the ring plate 46 can be wire bonded to selected bond pads on the die 68 (FIG. 6) and to selected lead fingers 58 (FIG. 6) to provide a ground (Vss) or power (Vcc) bus. In addition, the ring plate 46 provides a heat conductive path from the die 68 (FIG. 6) to the terminal leads 88 (FIG. 6) to dissipate heat generated by the die 68.

As shown in FIG. 5, the ring plate 46 can be attached to the lead plate 44 using an adhesive layer 90. A representative thickness of the adhesive layer 90 can be from about 1 mil to 5 mils. Preferably, the adhesive layer 90 comprises a double sided adhesive tape, but can also be a deposited and cured material.

An exemplary adhesive tape includes a flexible polymeric material coated on both sides with a thermoset adhesive such as an epoxy, acrylic, silicone or polyimide. This type of double side adhesive tape is also known as LOC tape. One suitable adhesive tape is Hitachi HM 122U tape manufactured by Hitachi Chemical Co. LTD. This tape has an overall thickness of about 3.5 mils (0.0035") and is coated with about a 0.8 mil (0.0008") thick layer of adhesive on both sides. Another suitable adhesive tape can be formed using a substrate comprising "KAPTON" tape manufactured by Dupont and an adhesive applied to both sides of the substrate.

The tape can be attached to the lead plate 44, or to the ring plate 46, using heat and pressure. Following assembly of the ring plate 46 to the lead plate 44, the adhesive layer 90 can be cured as required in an oven.

Referring to FIG. 5, the die mounting plate 48 is shown. The die mounting plate 48 can have a rectangular shape that is about the same size or slightly larger the ring plate 44. In addition, the die mounting plate 48 can be formed of the same materials and with the same thickness as the ring plate 82. The die mounting plate 48 can also include bonding sites equivalent to the bonding sites 84, 86 (FIG. 4B) previously described for ring plate 82. Still further, the die mounting plate 48 can be attached to the lead plate 44 using an adhesive layer 92 substantially similar to the adhesive layer 90 previously described.

The die mounting plate 48 includes a die mounting surface 94 wherein the die 68 (FIG. 6) can be adhesively attached. The die mounting surface 94 is located proximate to the rectangular opening 80 defined by the tip portions 60 of the lead fingers 58. As will be further explained, the die mounting plate 48 can be wire bonded to selected bond pads on the die 68 (FIG. 6) and to selected lead fingers 58 (FIG. 6) to provide a ground (Vss) or power (Vcc) bus. In addition, the die mounting plate 48 provides a heat conductive path from the die 68 (FIG. 6) to the terminal leads 88 (FIG. 6) to dissipate heat generated by the die 68.

Referring to FIG. 6, the semiconductor package 70 fabricated using the lead frame 40 (FIG. 3) is illustrated. The package 70 includes a singulated portion of the lead frame 40 (FIG. 3) which is bounded by the slots 76, 78 (FIG. 4A). The package 70 includes the semiconductor die 68 which has been attached to the die mounting surface 94 on the die mounting plate 48. An adhesive layer 96 can be used to bond the die 68 to the die mounting surface 94. The adhesive layer 96 can comprise a conventional polymer adhesive, such as an epoxy or polyimide.

The package 70 also includes terminal leads 88 formed by the terminal portions 62 of the lead fingers 58. For illustrative purposes the terminal leads 88 are shown extending straight out of the package. However, the terminal leads 88 can be shaped in a standard lead configuration such as J-bend, gull wing, flat or butt joint.

The package 70 also includes a plastic body 98 formed using a conventional molding process. The plastic body 98 completely encapsulates the die 68, the ring plate 46 and the die mounting plate 48.

A first set of metal wires 100 are wire bonded to selected bond pads 108 on the die 68 and to the tip portions 60 of the lead fingers 58. In general, the bond pads 108 that are bonded to the metal wires 100 are adapted to send and receive various signals such as input/output signals and timing signals for the integrated circuits contained on the die 68. The lead fingers 58 and wires 100 thus form internal signal traces for the package 70.

A second set of metal wires 102 are wire bonded to selected bond pads 108 on the die 68 and to bonding sites 106 on the die mounting plate 48. The die mounting plate 48 can also be electrically connected to selected terminal leads 88 of the package 70. The electrical connection between the die mounting plate 48 and terminal leads 88 can be with wire bonded wires or with metal tabs as described in U.S. Pat. No. 4,835,120. This electrical connection can also be formed using a conductive material such as a conductive polymer or solder applied to select portions of the die mounting plate 48 and lead fingers 58. With this arrangement, the die mounting plate 48 can be configured as either a ground plane for the (Vss) bond pads on the die 68, or a power plane for the (Vcc) bond pads on the die 68.

A third set of metal wires 104 are wire bonded to selected bond pads 108 on the die 68 and to bonding sites 84 on the ring plate 46. The ring plate 46 can also be electrically connected to selected terminal leads 88 of the package 70 as previously described for die mounting plate 48. With this arrangement, the ring plate 46 can be configured as either a ground plane for the (Vss) bond pads on the die 68, or a power plane for the (Vcc) bond pads on the die 68.

Figure 6A:
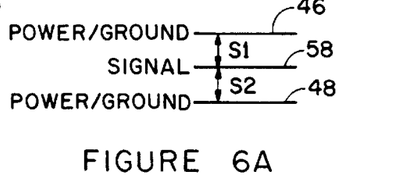
FIG. 6A is a schematic diagram showing the location of power/ground planes for the package with respect to a signal plane of the package.

FIG. 6A is a schematic representation showing the power/ground plane provided by the ring plate 46 and the power/ground plane provided by the die mounting plate 48. The signals transmitted through the lead fingers 58 can be referenced to the power/ground planes.

Figure 7:
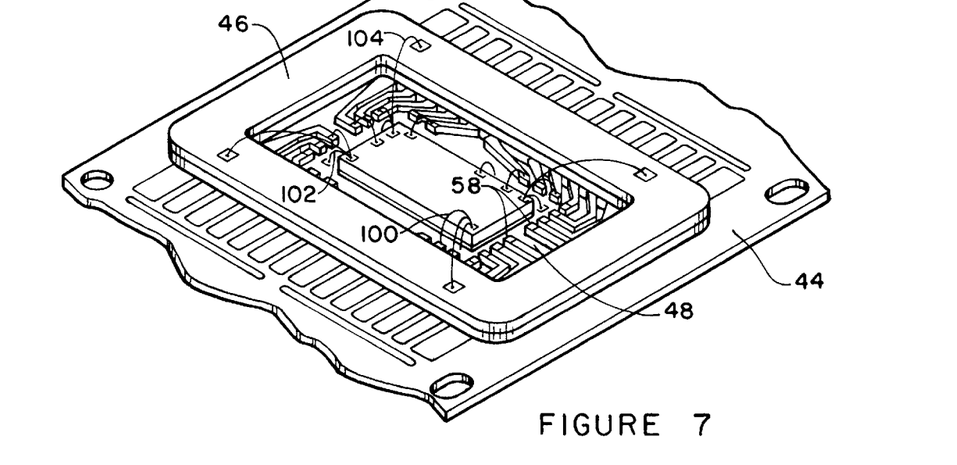
FIG. 7 is a schematic perspective view illustrating wire bonding of a semiconductor die to the lead frame.

FIG. 7 is a schematic perspective of a portion of the package 70 illustrating wire bonding of wires 100 to the lead fingers 58, of wires 102 to the die mounting plate 48, and of wires 104 to the ring plate 46.

In addition to providing ground and voltage planes for the die 68, the die mounting plate 48 and ring plate 46 also provide a heat transfer path from the die 68 to the terminal leads 88 of the package 70. The thermal performance of the package 70 is thus improved. In addition, self and mutual inductance generated by electric signals transmitted through the terminal leads 88 is reduced.

Figure 8:
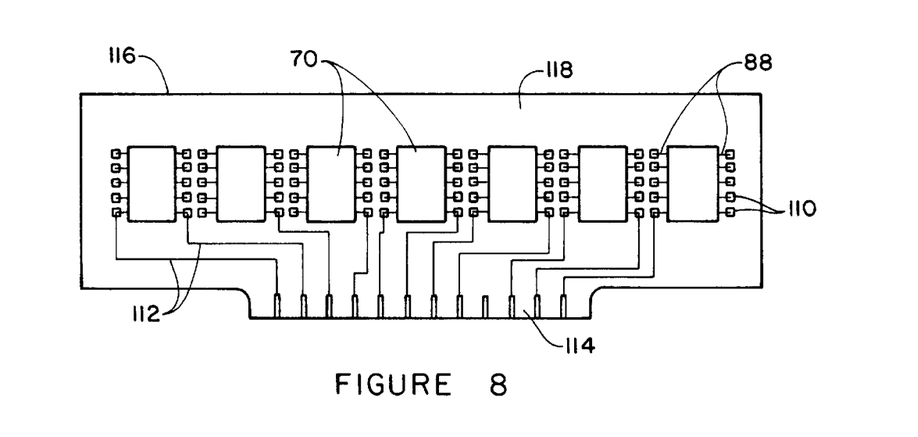
FIG. 8 is a schematic plan view of a memory module that includes semiconductor packages as in FIG. 6.

The die mounting plate 48 and ring plate 46 can also be used to match the impedance of the lead fingers 58 and terminal leads 88 for the package 70 to other electrical components. For example, in FIG. 8 a memory module 116 includes a substrate 118 on which multiple semiconductor packages 70. The substrate 118 can comprise an electrically insulating material such as ceramic or a glass filled resin. The substrate 118 includes electrodes 110 which are electrically connected to the terminal leads 88 on the packages 70 such as by soldering or with conductive adhesives. The substrate 118 also includes conductive traces 112 and an edge connector 114 in electrical communication with electrodes 110 and terminal leads 88.

The impedance of the terminal leads 88 and lead fingers 58 of the packages 70 can be matched to the impedance of the conductive traces 112 on the substrate 118 by selecting a desired spacing distance S1 (FIG. 6A) of the ring plate 46 (FIG. 6A), and a desired spacing distance S2 (FIG. 6A) of the die mounting plate 48 (FIG. 6A), with respect to the lead fingers 58 (FIG. 6). In general, the spacing distances S1 and S2 will be a function of the thicknesses of the adhesive layers 90 and 92 (FIG. 6).

Figure 9A:
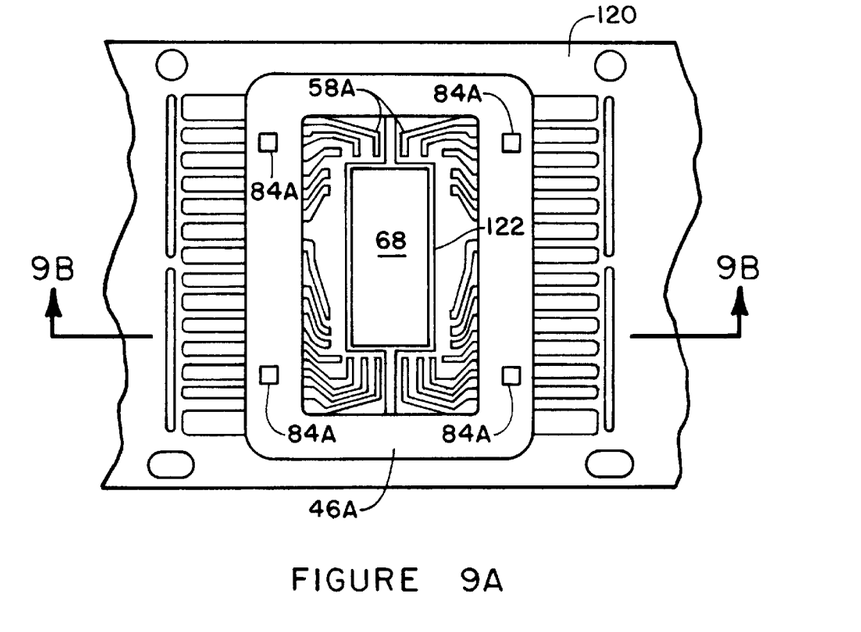
FIG. 9A is an enlarged plan view of a portion of an alternate embodiment lead frame.
Figure 9B:
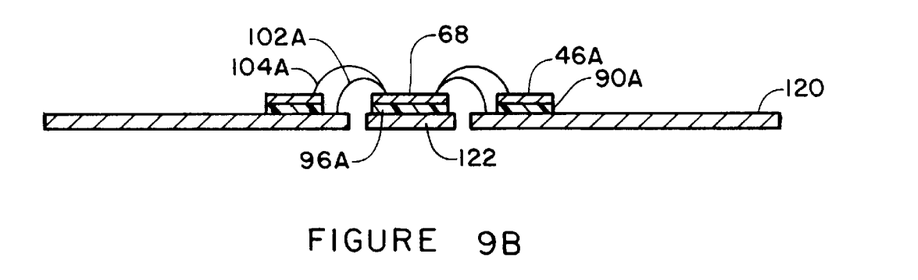
FIG. 9B is a cross sectional view taken along section line 9B—9B of FIG. 9A.
Figure 9C:
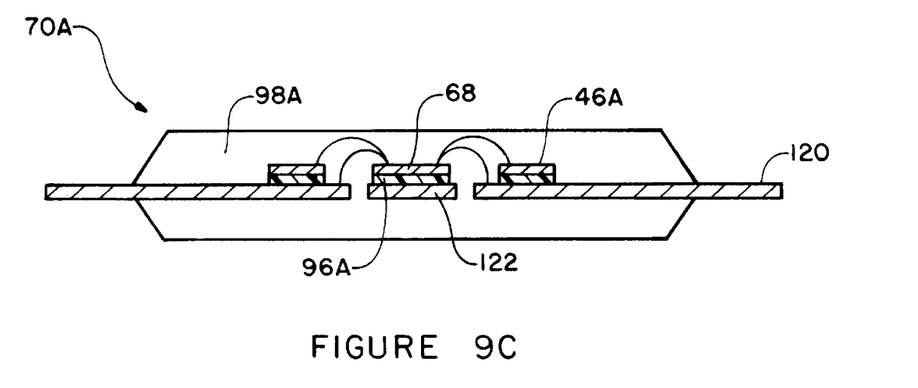
FIG. 9C is an enlarged cross sectional view of an alternate embodiment semiconductor package fabricated using the lead frame of FIG. 9A.

Referring to FIGS. 9A–9C, an alternate embodiment lead frame 120 (FIG. 9A) and semiconductor package 70A (FIG. 9C) are illustrated. The lead frame 120 includes lead fingers 58A configured for wire bonding to the die 68 substantially as previously described. In addition, the lead frame 120 includes a die mounting paddle 122 wherein the die 68 is mounted. The die 68 can be attached to the die mounting paddle 122 using an adhesive layer 96A formed of epoxy, silicone or other suitable material.

The lead frame 120 also includes a ring plate 46A, configured substantially as previously described for ring plate 46. The ring plate 46A is attached to the terminal portions of the lead fingers 58A using an adhesive layer 90A (FIG. 9B). The adhesive layer 90A can be formed substantially as previously described for adhesive layer 90 (FIG. 6). The ring plate 46A also includes multiple bonding sites 84A. Wires 104A can be wire bonded to the bonding sites 84A, and to the bond pads on the die 68, substantially as previously described. In addition, wires 102A can be wire bonded to the bond pads on the die 68, and to the lead fingers 58A. As shown in FIG. 9C, a plastic body 98A can be molded on the lead frame 120 to encapsulate the die 68 to complete the package 70A.

Thus the invention provides an improved multi layered lead frame and an improved semiconductor packages and electronic assemblies fabricated using the lead frame. Although the invention has been described with reference to certain preferred embodiments, as will be apparent to those skilled in the art, certain changes and modifications can be made without departing from the scope of the invention as defined by the following claims.

I claim:

1. A semiconductor lead frame comprising:
   a lead plate having a first sides an opposing second side and a die mounting site, the lead plate comprising a plurality of lead fingers;
   a first plate attached to the first side comprising a die mounting surface configured to mount a semiconductor die proximate to the die mounting site, and a first bonding site configured for wire bonding to a first bond pad on the die;
   a first adhesive layer attaching the first plate to the lead plate and spacing the first plate from the lead plate by a first distance;
   a second plate attached to the second side proximate to the die mounting site, the second plate including a second bonding site configured for wire bonding to a second bond pad on the die; and
   a second adhesive layer attaching the second plate to the lead plate and spacing the second plate from the lead plate by a second distance.

2. The lead frame of claim 1 wherein the first plate and the second plate comprise metals and provide heat transfer surfaces for conducting heat.

3. The lead frame of claim 1 wherein the first bond pad comprises a power or ground pad and the first plate comprises a power or ground plane.

4. The lead frame of claim 1 wherein the second bond pad comprises a power or ground pad and the second plate comprises a power or ground plane.

5. The lead frame of claim 1 wherein the second plate comprises a ring substantially enclosing the lead fingers.

6. A semiconductor lead frame comprising:
   a lead plate having a first side and an opposing second side, the lead plate comprising a die mounting site comprising a plurality of lead fingers configured to form internal signal traces for a semiconductor package;
   a first plate attached to the first side, the first plate configured to mount a semiconductor die proximate to the die mounting site, to provide a heat transfer surface in the package, and to prevent bowing of the package, the first plate comprising a first bonding site configured for wire bonding to a first bond pad on the die; and
   a second plate attached to the second side comprising a second bonding site configured for wire bonding to a second bond pad on the die.

7. The lead frame of claim 6 wherein the second plate is configured to provide a second heat transfer surface and to prevent bowing of the package.

8. The lead frame of claim 6 wherein the second plate comprises a frame like member with an opening.

9. A semiconductor lead frame for fabricating a semiconductor package comprising:
   a lead plate having a first side, an opposing second side, and a die mounting site comprising a plurality of lead fingers having tip portions forming a peripheral opening;
   a first plate attached to the first side comprising a die mounting surface configured to mount a semiconductor die within the first opening, the first plate including a first bonding site configured for wire bonding to a first bond pad on the die; and
   a second plate attached to the second side and having a through opening encompassing the peripheral opening and the die mounted to the die mounting surface on the first plate, the second plate comprising a second bonding site configured for wire bonding to a second bond pad on the die;
   the first plate and the second plate configured to provide heat transfer surfaces for the die and to prevent bowing of the package.

10. The lead frame of claim 9 wherein the first plate and the second plate comprise metal plates.

11. The lead frame of claim 9 wherein the second plate comprises a metal plate having a ring shape.

12. A semiconductor lead frame for fabricating semiconductor packages comprising:
   a lead plate having a first sides an opposing second side and a plurality of die mounting sites thereon, the lead plate comprising a plurality of lead fingers configured to form internal signal traces for a plurality of semiconductor packages fabricated using the lead frame;
   a plurality of die mounting plates attached to the first side and having a plurality of die mounting surfaces configured to mount a plurality of semiconductor dice proximate the die mounting sites, the die mounting plates including a plurality of first bonding sites configured for wire bonding to a plurality of first bond pads on the dice, the first bond pads comprising power or ground pads, the die mounting plates forming power or ground buses for the packages; and
   a plurality of ring plates attached to the second side proximate to the die mounting sites, the ring plates including a plurality of second bonding sites configured for wire bonding to a plurality of second bond pads on the dice, the ring plates forming power or ground buses for the packages.

13. The lead frame of claim 12 further comprising a plurality of first adhesive layers attaching the die mounting plates to the lead plate.

14. The lead frame of claim 12 further comprising a plurality of second adhesive layers attaching the ring plates to the lead plate.

15. The lead frame of claim 12 wherein the die mounting plates and the ring plates comprise metal plates configured to provide heat transfer surfaces from the die.

16. The lead frame of claim 12 wherein the ring plates are generally rectangular shared and have generally rectangular shaped openings.

17. The lead frame of claim 12 wherein the die mounting plates and the ring plates comprise metal plates configured to prevent bowing of the packages.

18. A semiconductor package comprising:
   a semiconductor die;
   a lead plate having a first side and an opposing second side and comprising a plurality of lead fingers configured to form signal traces for the package;
   a first plate attached to the first side by a first adhesive layer, the first plate having a die mounting surface for mounting the semiconductor die proximate the lead fingers, the first plate including a first bonding site configured for wire bonding to a first bond pad on the die;
   a second plate attached to the second side proximate to the lead fingers by a second adhesive layer, the second plate including a second bonding site configured for wire bonding to a second bond pad on the die; and
   a plastic body encapsulating the die and at least a portion of the lead plate;

the first plate and the second plate comprising metal plates configured to prevent bowing of the body.

19. The package of claim 18 wherein the first plate and the second plate are configured to provide heat transfer surfaces for the die.

20. The package of claim 21 wherein the lead plate comprises a segment of a lead frame.

21. A semiconductor package comprising:

a semiconductor die;

a lead plate having a first side and an opposing second side, the lead plate comprising a segment of a lead frame comprising a plurality of lead fingers configured to form internal signal traces for the package;

a first plate attached to the first side using a first adhesive layer and spaced from the lead fingers by a first distance equal to a first thickness of the first adhesive layer, the first plate configured to mount the die proximate the lead fingers, the first plate comprising a first bonding site configured for wire bonding to a first bond pad on the die; and a second plate attached to the second side using a second adhesive layer and spaced from the lead fingers by a second distance equal to a second thickness of the second adhesive layer, the second plate comprising a second bonding site configured for wire bonding to a second bond pad on the die;

the first plate and the second plate comprising metal plates configured to provide heat transfer surfaces for the die.

22. The package of claim 21 further comprising a plastic body at least partially encapsulating the die and at least a portion of the lead plate.

23. The package of claim 21 wherein the second plate comprises an opening wherein the die is mounted.

24. The package of claim 21 wherein the first adhesive layer and the second adhesive layer comprise a polymer material.

25. A semiconductor package comprising:

a lead frame comprising a die mounting paddle and a plurality of lead fingers configured to form signal traces and terminal leads for the package;

a semiconductor die attached to the die mounting paddle, the die including a first bond pad wire bonded to a first bonding site on a lead finger;

a ring plate attached to the lead frame proximate to the lead fingers, the ring plate including a second bonding site wire bonded to a second bond pad on the die; and a plastic body encapsulating the die, the ring plate and at least a portion of the lead frame;

the ring plate comprising a metal plate configured to reduce bowing of the elastic body.

26. The package of claim 25 further comprising an adhesive layer configured to space the ring plate from the lead frame.

27. The package of claim 25 wherein the ring plate comprises a ground plane or a power plane for the package.

28. The package of claim 25 wherein the ring plate comprises an opening surrounding the die.

29. An electronic assembly comprising:

a substrate including a conductive trace;

at least one semiconductor package mounted to the substrate in electrical communication with the conductive trace;

the package comprising:
a semiconductor die;
a lead plate having a first side and an opposing second side, the lead plate comprising a plurality of lead fingers configured to form signal traces for the package;
a first plate attached to the first side and configured to mount the semiconductor die proximate the lead fingers, the first plate including a first bonding site configured for wire bonding to a first bond pad on the die;
a second plate attached to the second side proximate to the lead fingers and including a second bonding site configured for wire bonding to a second bond pad on the die;
the first plate and the second plate comprising metal plates configured to prevent bowing of the package and to provide heat transfer surfaces for the package.

30. The assembly of claim 29 wherein the lead plate comprises a segment of a lead frame.

31. The assembly of claim 29 wherein the package comprises a plastic body.

* * * * *

UNITED STATES PATENT AND TRADEMARK OFFICE
CERTIFICATE OF CORRECTION

PATENT NO.   : 6,153,924
DATED        : November 28, 2000
INVENTOR(S)  : Larry D. Kinsman Page 1 of 1

It is certified that error appears in the above-identified patent and that said Letters Patent is hereby corrected as shown below:

Claim 1, column 7,
Line 6, change "sides" to -- side --.

Claim 12, column 8,
Line 16, change "sides" to -- side --.

Claim 16, column 8
Line 46, change "shared' to -- shaped --.

Claim 25, column 10,
Line 7, change "elastic" to -- plastic --.

Signed and Sealed this

Twenty-fifth Day of September, 2001

Attest:

NICHOLAS P. GODICI
Acting Director of the United States Patent and Trademark Office Attesting Officer